(12) United States Patent
Rice

(10) Patent No.: US 8,729,964 B2
(45) Date of Patent: May 20, 2014

(54) POWER ENVELOPE CONTROLLER AND METHOD

(75) Inventor: Martin J. Rice, Sagamore Hills, OH (US)

(73) Assignee: Keithley Instruments, Inc., Cleveland, OH (US)

(\*) Notice: Subject to any disclaimer, the term of this patent is extended or adjusted under 35 U.S.C. 154(b) by 0 days.

(21) Appl. No.: 13/549,338

(22) Filed: Jul. 13, 2012

(65) Prior Publication Data

US 2014/0015612 A1    Jan. 16, 2014

(51) Int. Cl.
    *H03F 1/52*      (2006.01)

(52) U.S. Cl.
    USPC .................................... 330/207 P; 330/102

(58) Field of Classification Search
    USPC ............................. 330/207 P, 285, 298, 102
    See application file for complete search history.

(56) References Cited

U.S. PATENT DOCUMENTS

| | | | |
|---|---|---|---|
| 5,039,934 A | 8/1991 | Banaska | |
| 5,144,154 A | 9/1992 | Banaska | |
| 7,486,137 B2 * | 2/2009 | Magoon et al. | 330/140 |
| 2007/0008038 A1 * | 1/2007 | Klepser et al. | 330/291 |

\* cited by examiner

*Primary Examiner* — Steven J Mottola
(74) *Attorney, Agent, or Firm* — Daniel S. Goldberg; Thomas F. Lenihan; Marger Johnson & McCollom, PC

(57) ABSTRACT

A power envelope controller configured for use with an amplification stage and method are disclosed. The power envelope controller includes voltage feedback input circuitry configured to receive a voltage feedback signal representing an internal voltage drop across the amplification stage and current feedback input circuitry configured to receive a current feedback signal representing an output current of the amplification stage. An analog multiplier is configured to generate an internal power dissipation signal representing the internal power dissipation of the amplification stage based on the voltage and current feedback signals. A comparator circuit is configured to compare the internal power dissipation signal to a power threshold and generate a power control error signal when the internal power dissipation of the amplification stage exceeds the threshold.

20 Claims, 3 Drawing Sheets

POWER ENVELOPE CONTROLLER AND METHOD

FIELD OF INVENTION

This invention relates generally to power amplifiers and, more particularly, to power amplifiers capable of source and sink mode operation.

BACKGROUND

Source measure units (SMU) are used to make precision measurements in many fields, including the testing of semiconductor products. For example, U.S. Pat. No. 5,039,934 describes one such device and range-changing in such a device is described in U.S. Pat. No. 5,144,154, both of which are incorporated herein by reference in their entireties. Source measure units force either a voltage or a current and then respectively measure a resulting current or voltage. SMUs may operate in source or sink mode. Internal power dissipation is equal to the output current multiplied by the difference in the internal voltage supply and the output voltage. Because sinkmode current is returned to the opposite voltage supply rail internally, the internal power dissipation in sinkmode is twice the maximum internal power dissipation in sourcemode. For this reason, output stage amplifiers and cooling are commonly designed for the worst-case (sinkmode) power dissipation. This usually results in over-designed cooling for the majority of users since sinkmode is typically used less often than sourcemode. Sometimes thermal monitoring is performed in the background, which is slow to respond and not necessarily robust. It is desirable to provide improved techniques for monitoring the safe operating areas of an SMU in both source and sinkmode operation.

SUMMARY OF THE INVENTION

A power envelope controller configured for use with an amplification stage is disclosed. The power envelope controller includes voltage feedback input circuitry configured to receive a voltage feedback signal representing an internal voltage drop across the amplification stage and current feedback input circuitry configured to receive a current feedback signal representing an output current of the amplification stage. An analog multiplier is configured to generate an internal power dissipation signal representing the internal power dissipation of the amplification stage based on the voltage and current feedback signals. A comparator circuit is configured to compare the power dissipation signal to a power threshold and generate a power control error signal when the internal power dissipation of the amplification stage exceeds the threshold.

The power envelope controller may include a current flow direction detector configured to determine a current flow direction at the output of the amplification stage. The voltage feedback input circuitry may include a polarity switch configured to change a polarity of the voltage feedback signal based on the current flow direction. The current feedback input circuitry may also include a polarity switch configured to change a polarity of the current feedback signal based on the current flow direction. The power envelope controller may include a power trend detector configured to detect whether the internal power dissipation of the amplification stage is increasing or decreasing. The comparator circuit may be configured with first and second power thresholds each associated with a different sinkmode quadrant.

The amplifier stage may be configured to reduce its power dissipation based on the power control error signal. The power envelope controller may include a summing block coupled to the amplifier stage, the summing block having a set point input, feedback input and an error signal output, the summing block being configured to generate an amplifier stage error signal based on the power control error signal. The summing block may be configured to generate an amplifier stage error signal based on a voltage/current feedback signal. The power envelope controller may include a priority switch configured to give priority to the power control error signal over voltage/current feedback signal.

A power envelope control method for use with an amplification stage is also disclosed. The method includes sensing a voltage feedback signal representing an internal voltage drop across the amplification stage and sensing a current feedback signal representing an output current of the amplification stage. The voltage and current feedback signals are multiplied to generate an internal power dissipation signal representing the internal power dissipation of the amplification stage. The internal power dissipation signal is compared to a power threshold to generate a power control error signal when the internal power dissipation of the amplification stage exceeds the threshold.

The method may also include determining a current flow direction at the output of the amplification stage. The method may also include comprising changing a polarity of the voltage feedback signal based on the current flow direction. The method may also include changing a polarity of the current feedback signal based on the current flow direction.

The method may also include detecting whether the internal power dissipation of the amplification stage is increasing or decreasing. The method may also include providing first and second power thresholds each associated with a different sinkmode quadrant. The amplifier stage may be configured to reduce its power dissipation based on the power control error signal. A summing block may be coupled to the amplifier stage, the summing block having a set point input, feedback input and an error signal output, the summing block being configured to generate an amplifier stage error signal based on the power control error signal. The summing block may be configured to generate an amplifier stage error signal based on a voltage/current feedback signal. The method may also include providing a priority switch configured to give priority to the power control error signal over voltage/current feedback signal.

DETAILED DESCRIPTION OF THE INVENTION

Disclosed herein is an apparatus and method that provides improved techniques for monitoring the safe operating areas of an SMU in both source and sinkmode operation. Assume an SMU is designed with a sourcemode upper limit of 200 W. Using the 2× sinkmode design criteria, this would require an upper limit of 400 W for sinkmode operation. Such a design would require large heatsinks and elaborate cooling designs.

Figure 1A:
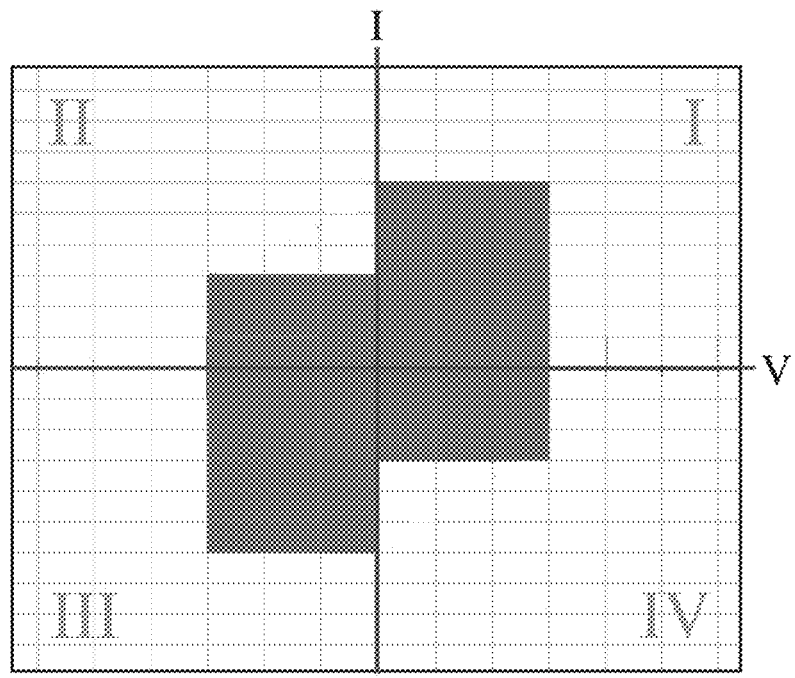
FIG. 1A is a graph showing an asymmetric power envelope.

The alternative would be an asymmetric power envelope as shown in FIG. 1A. It should be understood that the SMU may be configured with multiple voltage or current ranges, e.g., ±3000V@20 mA and ±1500V@120 mA. FIG. 1A shows a power envelope where the sinkmode power is limited based on the selected range yielding a stepped shape in quadrants II and IV. This solution leaves the user with an awkward transition at the threshold from source to sink mode and eliminates capability that the user would otherwise benefit from (power within the designed 200 W internal capability).

Figure 2:
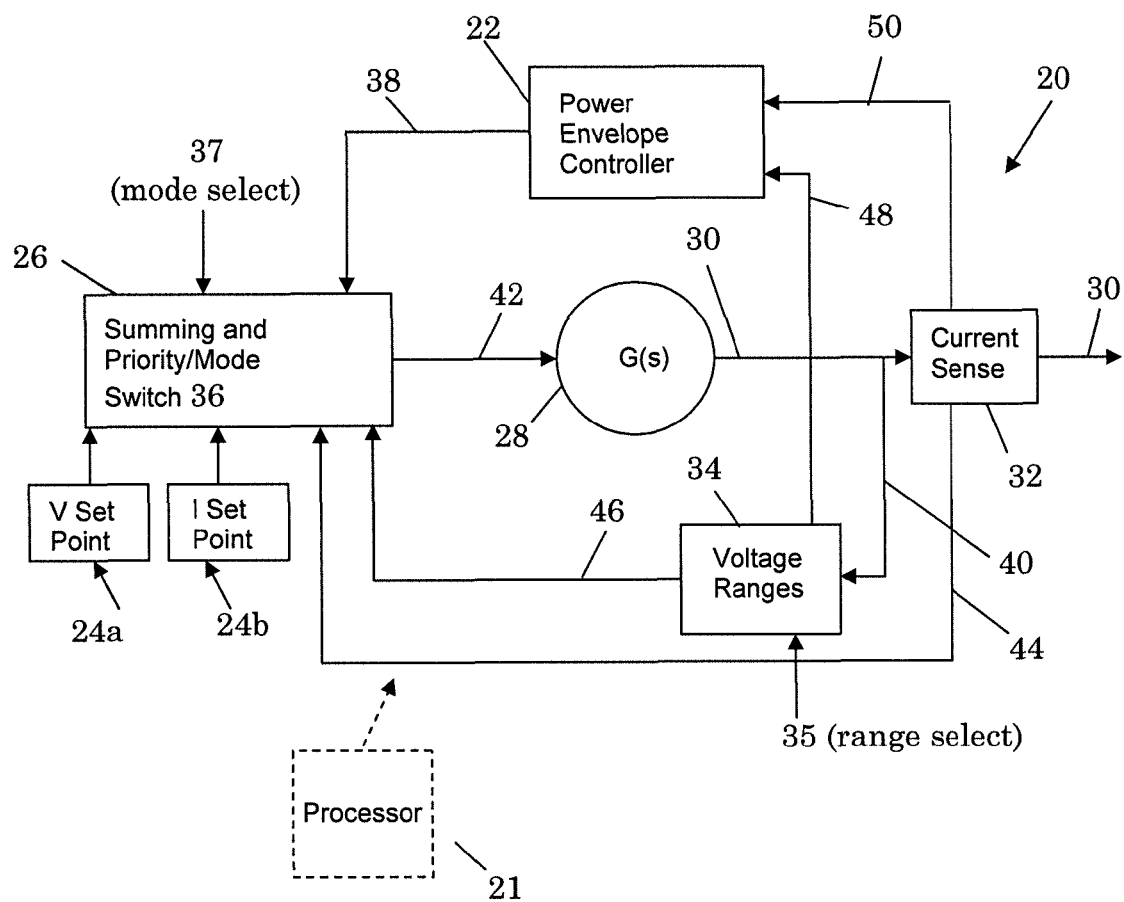
FIG. 2 is a block diagram of a source measurement unit including a power envelope controller.

As disclosed herein, a power envelope controller may be integrated into the SMU as shown in FIG. 2. In general, the SMU 20 includes at least one set point input, e.g., voltage set point input 24a and current set point input 24b, a summing bock 26, a gain stage 28 configured to generate an output 30 and a power envelope controller 22. The set point inputs 24a, 24b are configured to receive user input requesting a given voltage and/or current via output 30. The gain stage 28 is configured to generate the desired output voltage or current based on the corresponding set point. The voltage/current set point is fed into a summing block 26. In general, feedback paths 40, 44 sense the output voltage or current (depending on the whether the SMU is operating in voltage or current mode) appearing at output 30. The voltage ranges block 34 scales the voltage feedback signal based on the selected voltage range as discussed below. The current feedback signal 44 and voltage feedback signal 46 are coupled to the summing block 26. In general operation, the voltage/current set points are subtracted from the corresponding feedback signal to generate an error signal 42.

The error signal 42 is fed into the gain stage 28. The gain stage is configured to increase or decrease the output voltage or current based on the error signal. For example, if the error signal is zero, the output voltage or current is not changed. If the error signal is positive or negative, the output voltage or current is increased or decreased respectively. Once the output voltage or current reaches the set point, the error signal goes to zero.

As discussed above, the SMU may be configured with multiple voltage or current ranges, e.g., ±3000V@20 mA and ±1500V@120 mA. The voltage ranges block 34 is configured to receive a range selection input 35 and change the gain of the feedback path depending on the selected range. This allows the voltage feedback signal 46 at the summing block 26 to remain independent of the selected range. Current sense block 32 is configured to provide a current feedback signal 44. It should be understood that a current sense resistor may be used to generate the current feedback signal, e.g., by sensing the voltage across the current sense resistor.

Power envelope controller 22 is generally a four-quadrant controller configured to ensure the SMU amplifier does not overheat, and also provides the user with access to a previously disabled region of the IV power envelope in sinkmode quadrants. The power envelope controller 22 is coupled to voltage feedback signal 48 (range independent as discussed above) and current feedback signal 50. The power envelope controller 22 is configured to calculate the power being dissipated internally by the SMU amplifier output stage (not load power) in four quadrants without firmware involvement. The power envelope controller 22 generates a power control error signal 38 that is coupled to the summing block 26 via the priority/mode switch 36 and limits output stage power dissipation to ensure power dissipation (cooling) limits are not exceeded. Summing block 26 includes a priority/mode switch 36 configured to give priority to the power control error signal 38 and override any error signal based on the voltage/current set points 24a, 24b and voltage/current feedback signals 46, 44.

Figure 3:
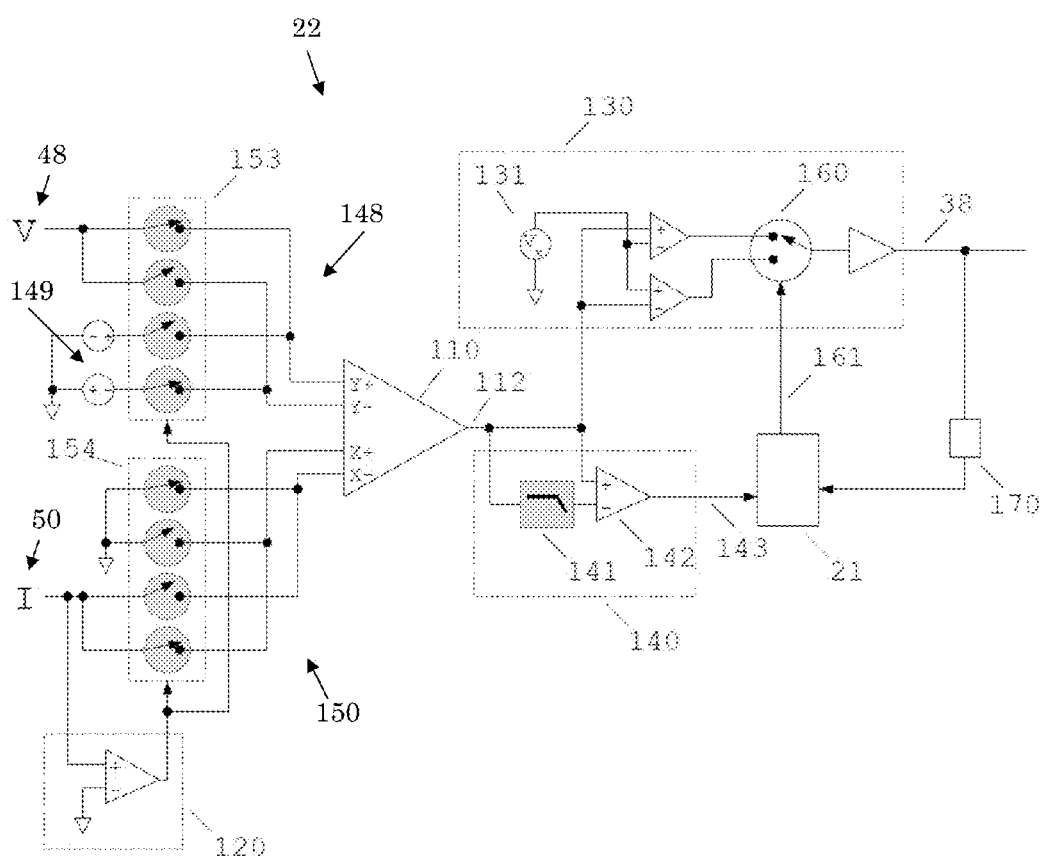
FIG. 3 is a schematic diagram of a power envelope controller.

FIG. 3 is a schematic diagram of a power envelope controller 22. The power envelope controller 22 includes voltage feedback input circuitry 148, current feedback input circuitry 150, an analog multiplier 110 and a compare block 130 having an output 38 configured to generate a power control error signal. Suitable analog multipliers are available from a variety of sources including Analog Devices (www.analog.com), e.g., the AD633AR analog multiplier.

It should be understood that load power is calculated by multiplying the output current by the output voltage. In contrast, internal power dissipation is equal to the output current multiplied by the difference in the output stage power supply voltage and the amplifiers output voltage (internal voltage drop across the amplification stage) as shown in the equation below:

Internal power=output current*(voltage supply−voltage output)

The voltage feedback input circuitry 148 includes voltage supply signals 149 from which the output voltage will be subtracted. A current flow direction detector 120 is coupled to the voltage feedback input 148 to determine the direction current is flowing at the output 30 of the SMU. Voltage feedback input circuitry 148 also includes a switch 153 configured to selected the proper voltage supply polarity based on the current flow direction. The analog multiplier 110 includes X and Y inputs each having differential input terminals as shown. Switch 153 is also configured to direct the output voltage feedback signal to appropriate Y terminal (inverting or non-inverting) of the analog multiplier 110 based on the current direction determined by the current flow direction detector 120 (depending on the quadrant of operation). In this example, the multiplier subtracts the inverting Y input from the non-inverting input before multiplying the X and Y inputs.

Similarly, the current feedback input circuitry 150 includes a switch 154 configured to direct the current feedback signal to appropriate X terminal (inverting or non-inverting) the analog multiplier 110 based on the current direction determined by the current flow direction detector 120 (depending on the quadrant of operation).

The output of the analog multiplier 110 (power dissipation signal) is coupled to the compare block 130. The compare block 130 includes a power threshold 131 configured to set the desired maximum power dissipation level for the SMU. The output of the compare block 38 is a power control error signal. In general, when the output power of the SMU is below the threshold, the power control error signal is zero. Once the output power of the SMU exceeds the below the threshold, the power control error signal becomes non-zero. The power control error signal is coupled to the SMU summing block 26 and overrides any error signal based on the voltage/current set points and voltage/current feedback signals.

Figure 1B:
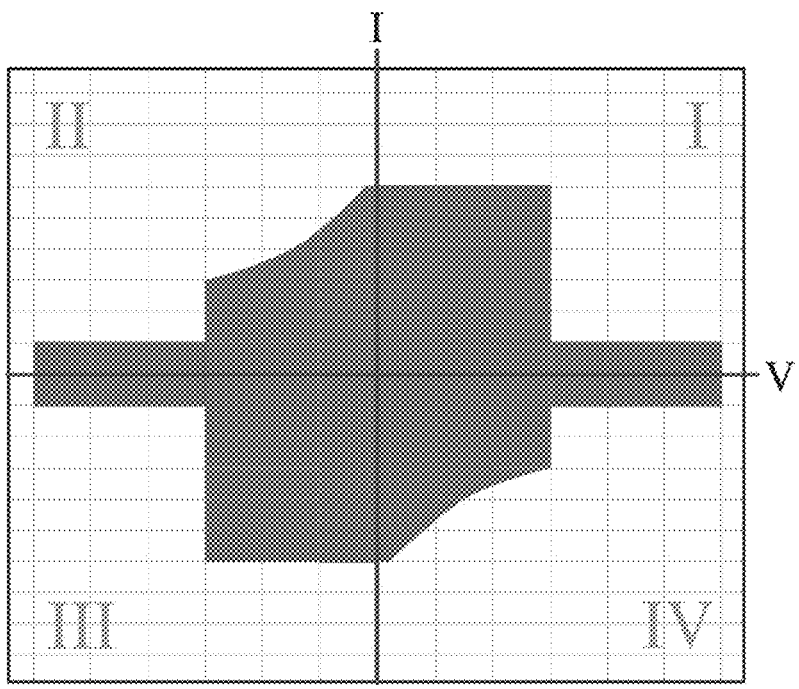
FIG. 1B is a graph showing an increased power envelope using a power envelope controller.

A non-zero power control error signal causes the output voltage to be increased or decreased (depending on the quadrant of operation) so that SMU power dissipation is reduced producing the power envelope shown in FIG. 1B. The power envelope controller 22 is configured for four quadrant operation. Depending on the mode of operation (source or sink) and quadrant of operation, an increase in voltage may actually reduce the power dissipation of the SMU. The power envelope controller 22 is configured to determine whether the polarity must be reversed in order to achieve a reduction in power dissipation. The power envelope controller 22 includes a power trend (slope) detector 140. The power trend detector is coupled to a time delay filter 141. Comparator 142 compares the current power level to the time delayed power level to determine the power trend (up or down). The comparator output 143 is monitored by the SMU processor 21 to determine whether power is decreasing. The power envelope controller 22 also includes a power direction switch 160. Based on the power trend, the SMU then sets a power direction signal 161 to reverse the polarity as needed via the power direction switch 160. The power envelope controller 22 also includes an activity circuit 170 configured to digitally signal to the SMU processor 21 that the power envelope controller 22 is active.

It should be understood that many variations are possible based on the disclosure herein. Although features and elements are described above in particular combinations, each feature or element can be used alone without the other features and elements or in various combinations with or without other features and elements.

What is claimed is:

1. A power envelope controller configured for use with an amplification stage, the power envelope controller comprising:
    voltage feedback input circuitry configured to receive a voltage feedback signal representing an internal voltage drop across the amplification stage;
    current feedback input circuitry configured to receive a current feedback signal representing an output current of the amplification stage;
    an analog multiplier configured to generate an internal power dissipation signal representing the internal power dissipation of the amplification stage based on the voltage and current feedback signals;
    a comparator circuit configured to compare the internal power dissipation signal to a power threshold and generate a power control error signal when the internal power dissipation of the amplification stage exceeds the threshold; and
    a power trend detector configured to detect whether the internal power dissipation of the amplification stage is increasing or decreasing.

2. A power envelope controller configured for use with an amplification stage, the power envelope controller comprising:
    voltage feedback input circuitry configured to receive a voltage feedback signal representing an internal voltage drop across the amplification stage;
    current feedback input circuitry configured to receive a current feedback signal representing an output current of the amplification stage;
    an analog multiplier configured to generate an internal power dissipation signal representing the internal power dissipation of the amplification stage based on the voltage and current feedback signals;
    a comparator circuit configured to compare the internal power dissipation signal to a power threshold and generate a power control error signal when the internal power dissipation of the amplification stage exceeds the threshold; and
    a current flow direction detector configured to determine a current flow direction at the output of the amplification stage.

3. The power envelope controller of claim 2, wherein the voltage feedback input circuitry comprises a polarity switch configured to change a polarity of the voltage feedback signal based on the current flow direction.

4. The power envelope controller of claim 2, wherein the current feedback input circuitry comprises a polarity switch configured to change a polarity of the current feedback signal based on the current flow direction.

5. A power envelope controller configured for use with an amplification stage, the power envelope controller comprising:
    voltage feedback input circuitry configured to receive a voltage feedback signal representing an internal voltage drop across the amplification stage;
    current feedback input circuitry configured to receive a current feedback signal representing an output current of the amplification stage;
    an analog multiplier configured to generate an internal power dissipation signal representing the internal power dissipation of the amplification stage based on the voltage and current feedback signals; and
    a comparator circuit configured to compare the internal power dissipation signal to a power threshold and generate a power control error signal when the internal power dissipation of the amplification stage exceeds the threshold;
    wherein the comparator circuit is configured with first and second power thresholds each associated with a different sinkmode quadrant.

6. The power envelope controller of claim 5, further comprising a power trend detector configured to detect whether the internal power dissipation of the amplification stage is increasing or decreasing.

7. The power envelope controller of claim 1, wherein the amplifier stage is configured to reduce its power dissipation based on the power control error signal.

8. A power envelope controller configured for use with an amplification stage, the power envelope controller comprising:
    voltage feedback input circuitry configured to receive a voltage feedback signal representing an internal voltage drop across the amplification stage;
    current feedback input circuitry configured to receive a current feedback signal representing an output current of the amplification stage;
    an analog multiplier configured to generate an internal power dissipation signal representing the internal power dissipation of the amplification stage based on the voltage and current feedback signals;
    a comparator circuit configured to compare the internal power dissipation signal to a power threshold and generate a power control error signal when the internal power dissipation of the amplification stage exceeds the threshold; and
    a summing block coupled to the amplifier stage, the summing block having a set point input, feedback input and an error signal output, the summing block being configured to generate an amplifier stage error signal based on the power control error signal.

9. The power envelope controller of claim 8, wherein the summing block is configured to generate an amplifier stage error signal based on a voltage/current feedback signal.

10. The power envelope controller of claim 9, further comprising a priority switch configured to give priority to the power control error signal over voltage/current feedback signal.

11. A power envelope control method for use with an amplification stage, the method comprising:
    sensing a voltage feedback signal representing an internal voltage drop across the amplification stage;

sensing a current feedback signal representing an output current of the amplification stage;

multiplying the voltage and current feedback signals to generate an internal power dissipation signal representing the internal power dissipation of the amplification stage;

comparing the internal power dissipation signal to a power threshold and generating a power control error signal when the internal power dissipation of the amplification stage exceeds the threshold; and detecting whether the internal power dissipation of the amplification stage is increasing or decreasing.

12. A power envelope control method for use with an amplification stage, the method comprising:

sensing a voltage feedback signal representing an internal voltage drop across the amplification stage;

sensing a current feedback signal representing an output current of the amplification stage;

multiplying the voltage and current feedback signals to generate an internal power dissipation signal representing the internal power dissipation of the amplification stage;

comparing the internal power dissipation signal to a power threshold and generating a power control error signal when the internal power dissipation of the amplification stage exceeds the threshold; and determining a current flow direction at the output of the amplification stage.

13. The method of 12, further comprising changing a polarity of the voltage feedback signal based on the current flow direction.

14. The method of 12, further comprising changing a polarity of the current feedback signal based on the current flow direction.

15. A power envelope control method for use with an amplification stage, the method comprising:

sensing a voltage feedback signal representing an internal voltage drop across the amplification stage;

sensing a current feedback signal representing an output current of the amplification stage;

multiplying the voltage and current feedback signals to generate an internal power dissipation signal representing the internal power dissipation of the amplification stage;

comparing the internal power dissipation signal to a power threshold and generating a power control error signal when the internal power dissipation of the amplification stage exceeds the threshold; and providing first and second power thresholds each associated with a different sinkmode quadrant for comparing to the power dissipation signal.

16. The method of 15, further comprising detecting whether the internal power dissipation of the amplification stage is increasing or decreasing.

17. The method of 11, wherein the amplifier stage is configured to reduce its power dissipation based on the power control error signal.

18. A power envelope control method for use with an amplification stage, the method comprising:

sensing a voltage feedback signal representing an internal voltage drop across the amplification stage;

sensing a current feedback signal representing an output current of the amplification stage;

multiplying the voltage and current feedback signals to generate an internal power dissipation signal representing the internal power dissipation of the amplification stage;

comparing the internal power dissipation signal to a power threshold and generating a power control error signal when the internal power dissipation of the amplification stage exceeds the threshold; and providing a summing block coupled to the amplifier stage, the summing block having a set point input, feedback input and an error signal output, the summing block being configured to generate an amplifier stage error signal based on the power control error signal.

19. The method of 18, wherein the summing block is configured to generate an amplifier stage error signal based on a voltage/current feedback signal.

20. The method of 18, further comprising providing a priority switch configured to give priority to the power control error signal over voltage/current feedback signal.

* * * * *